(12) United States Patent
Lotter

(10) Patent No.: US 11,017,285 B2
(45) Date of Patent: May 25, 2021

(54) METHOD FOR OPTIMIZING THE ANTENNA CONFIGURATION OF A BOOSTER

(71) Applicant: Nextivity, Inc., San Diego, CA (US)

(72) Inventor: Michiel Petrus Lotter, San Diego, CA (US)

(73) Assignee: NEXTIVITY, INC., San Diego, CA (US)

(*) Notice: Subject to any disclaimer, the term of this patent is extended or adjusted under 35 U.S.C. 154(b) by 49 days.

(21) Appl. No.: 16/128,240

(22) Filed: Sep. 11, 2018

(65) Prior Publication Data

US 2019/0080221 A1 Mar. 14, 2019

Related U.S. Application Data

(60) Provisional application No. 62/556,981, filed on Sep. 11, 2017.

(51) Int. Cl.
| | |
|---|---|
| *H01Q 3/24* | (2006.01) |
| *G06K 19/077* | (2006.01) |
| *H04B 17/318* | (2015.01) |
| *H01Q 1/24* | (2006.01) |
| *G01R 19/04* | (2006.01) |
| *G06K 7/10* | (2006.01) |

(52) U.S. Cl.
CPC ....... *G06K 19/07794* (2013.01); *G01R 19/04* (2013.01); *H01Q 1/243* (2013.01); *H04B 17/318* (2015.01); *G06K 7/10346* (2013.01)

(58) Field of Classification Search
CPC .. H01Q 1/24; H01Q 1/32; H01Q 3/24; H01Q 3/242; H01Q 1/243; H04B 17/318; H04B 7/04; H04B 7/1555; H04B 7/15535; G06K 19/07; G06K 19/07794; G01R 19/04
USPC ........................................................ 343/703
See application file for complete search history.

(56) References Cited

U.S. PATENT DOCUMENTS

| | | | | |
|---|---|---|---|---|
| 8,693,945 | B2* | 4/2014 | Kummetz | H04B 7/2606 455/11.1 |
| 10,305,192 | B1* | 5/2019 | Rappaport | H01Q 21/205 221/205 |
| 2005/0208907 | A1* | 9/2005 | Yamazaki | H03F 1/34 455/126 |
| 2005/0227646 | A1* | 10/2005 | Yamazaki | H03F 3/45192 455/127.3 |
| 2007/0218951 | A1* | 9/2007 | Risheq | H04B 7/15535 455/562.1 |
| 2016/0269132 | A1* | 9/2016 | Clark | H01Q 3/242 |
| 2018/0331752 | A1* | 11/2018 | Ashworth | H04B 7/15542 |

* cited by examiner

*Primary Examiner* — Hoang V Nguyen
(74) *Attorney, Agent, or Firm* — Kilpatrick Townsend & Stockton LLP

(57) ABSTRACT

A system, method and computer program product for optimizing an antenna pattern for a booster, in which input signals from different operators are transmitted at different carrier frequencies within an operating bandwidth. An input bandwidth of a plurality of input signals are monitored at an input of the booster, the input bandwidth being within the operating bandwidth. One or more peak signal levels of the plurality of input signals within the input bandwidth are detected. Each of the detected one or more peak signal levels of the plurality of input signals at the input of the booster are then adjusted, such that a peak signal level of each of the plurality of input signals are substantially equal.

15 Claims, 3 Drawing Sheets

METHOD FOR OPTIMIZING THE ANTENNA CONFIGURATION OF A BOOSTER

CROSS REFERENCE TO RELATED APPLICATIONS

This application claims priority under 35 U.S.C. § 119(e) to U.S. Provisional Application No. 62/556,981, filed on Sep. 11, 2017, and entitled Method for Optimizing the Antenna Configuration of a Booster, the disclosure of which is incorporated herein by reference.

BACKGROUND

There are basically three approaches to choosing an antenna to be used with an off-air signal booster, or repeater. First, an omni-directional antenna may be used as a donor antenna. This has the advantage of being easy to install as no pointing of the antenna is required. However, it has two drawbacks. First, the gain of an omni-directional antenna is per definition lower than that of a directional antenna, and second, the omni-directional antenna has no capability to reduce the level at which interfering signals is received.

A second antenna approach would be to use some form of directional antenna, such as a panel antenna or a Yagi antenna as a donor antenna. These antennas have an advantage in that their gain is higher than an omni-directional antenna, and also that they reduce the level of signals received from angles where the directional antenna has a reduced gain. The downside of such an approach is that the antenna must be pointed in the correct direction to maximize the donor signal, which may be difficult to do. Also, the best direction in which to point the antenna may be different for different donor signals if the donor signals come from different base stations.

To overcome these limitations, an adaptive antenna, such as an antenna array, may be used. An antenna array would require no manual pointing, and can be controlled to optimize the donor signal. Such optimization would come in roughly two categories: beam forming and null steering. In the case of beam forming, the antenna array is controlled in a way that maximizes the gain of the array in one or more directions. The number of directions in which the beam can be pointed is typically a function of the number of elements in the array. In the case of null steering, a null is formed in the direction of an interfering signal in order to remove the signal from the received signal and the booster or repeater input. As in the case of beam steering, the number of nulls is a function of the size of the array. Typically, an array with N elements can form N−1 nulls. Note that although the example of an antenna array is used here, other forms of active antenna control may be used.

In the above-mentioned cases, the goal of the optimization is either to null out one or more signals or make one or more signals as strong as possible. In the case of a wideband booster or repeater (where a wideband booster may be similar to those defined in the FCC Part 20 rules as wideband consumer signal boosters), such an approach may not lead to an optimum antenna solution.

Specifically, in the case of a wideband booster, the total amount of power available at any booster output port (donor or server) is shared between all signals received by the booster. For example, assume the booster's omni-directional donor antenna can see 3 base stations belonging to operators 1, 2 and 3. Operator 1 is received at a relatively high level, operator 2 at a medium level and operator 3 at a low level. At the output of the booster, the signals from each operator would be present in the same proportion as at its input. In other words, the weakest signal from operator 3 would be the weakest signal at the output of the booster and hence the coverage for operator three provided for operator 3 will be the smallest. This is exactly the opposite of what is desired.

In order to solve the above-described problems using the standard state of the art, a directional antenna may be deployed and pointed to operator 3's base station. This will clearly boost the level of operator 3, but may lower the levels of the donor signals from operators 2 and 3. In fact, it is conceivable that operator 2 now becomes the weakest input and hence the weakest output with the smallest coverage area at the booster output port. Thus, conventional systems or methods would either null a donor signal or boost a donor signal as much as possible and not attempt to equalize the input signal levels from different base stations.

SUMMARY

This document describes a system and method to optimize an antenna pattern of a booster's donor antenna in such a way that the input signal level from all donor base stations is roughly equivalent. Such an optimization is novel in that repeaters are configured to either null a donor signal or boost a donor signal as much as possible and not attempt to equalize the input signal levels from different base stations. Thus, instead of maximizing antenna gain in a specific direction, the algorithm may boost the antenna a little in one direction and reduce it slightly in another direction, so as to achieve the desired effect of having a constant input signal level across base stations and hence have as close to a constant output level for the signals of each base station on the server side. In this manner, the coverage footprint provided by the booster for each base station is equal.

In several aspects, a system, method and computer program product are provided, for optimizing an antenna pattern for a booster, in which input signals from different operators are transmitted at different carrier frequencies within an operating bandwidth. Each of the system, method and computer program product execute a process that includes steps of monitoring an input bandwidth of a plurality of input signals at an input of the booster, the input bandwidth being within the operating bandwidth. The process further includes detecting one or more peak signal levels of the plurality of input signals within the input bandwidth, adjusting, by the booster, each of the detected one or more peak signal levels of the plurality of input signals at the input of the booster, such that a peak signal level of each of the plurality of input signals are substantially equal. The monitoring, detecting, and adjusting are performed by a control processor associated with the booster.

The details of one or more embodiments are set forth in the accompanying drawings and the description below. Other features and advantages will be apparent from the description and drawings, and from the claims.

BRIEF DESCRIPTION OF THE DRAWINGS

These and other aspects will now be described in detail with reference to the following drawings.

DETAILED DESCRIPTION

Figure 3:
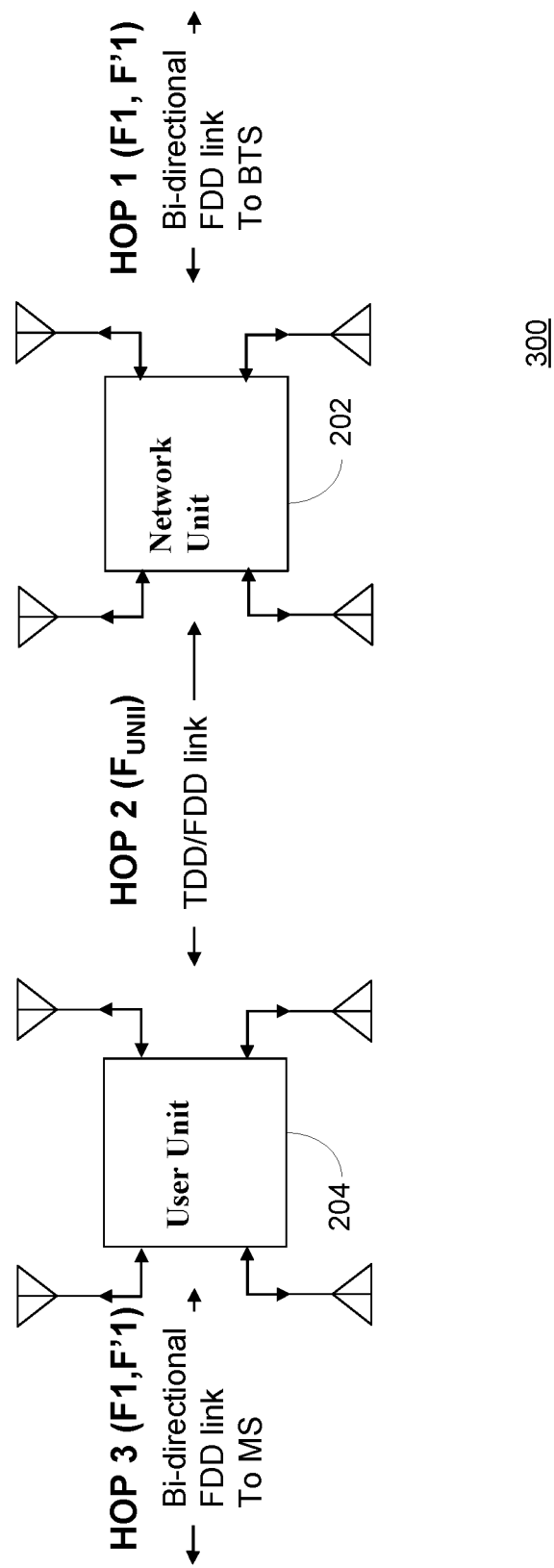
FIG. 3 illustrates a booster in accordance with implementations described herein.

This document describes a system and method to optimize an antenna pattern of a booster's donor antenna in such a way that the input signal level from all donor base stations is roughly equivalent. One such booster is shown in FIG. 3, which shows a booster 300 as implemented as a three-hop repeater. The booster 300 includes a network unit 302, or "server unit," that communicates with a number of wireless base stations in a wireless communication network. The booster 300 further includes a user unit 304 that communications with the network unit 302 via a second or intermediate hop, and the user unit 304 communicates with a number of user devices, such as a mobile device, computer, tablet computer, etc.

Accordingly, instead of maximizing antenna gain in a specific direction, a control processor executing an algorithm may boost the antenna pattern in one direction and reduce the pattern in another direction so as to achieve the desired effect of having a constant input signal level across a number of base stations in a wireless communications network, and hence have as close to a constant output level for the signals on a server side of each base station. Accordingly, a coverage footprint of an antenna pattern provided by the booster for each base station is substantially equal.

Figure 1:
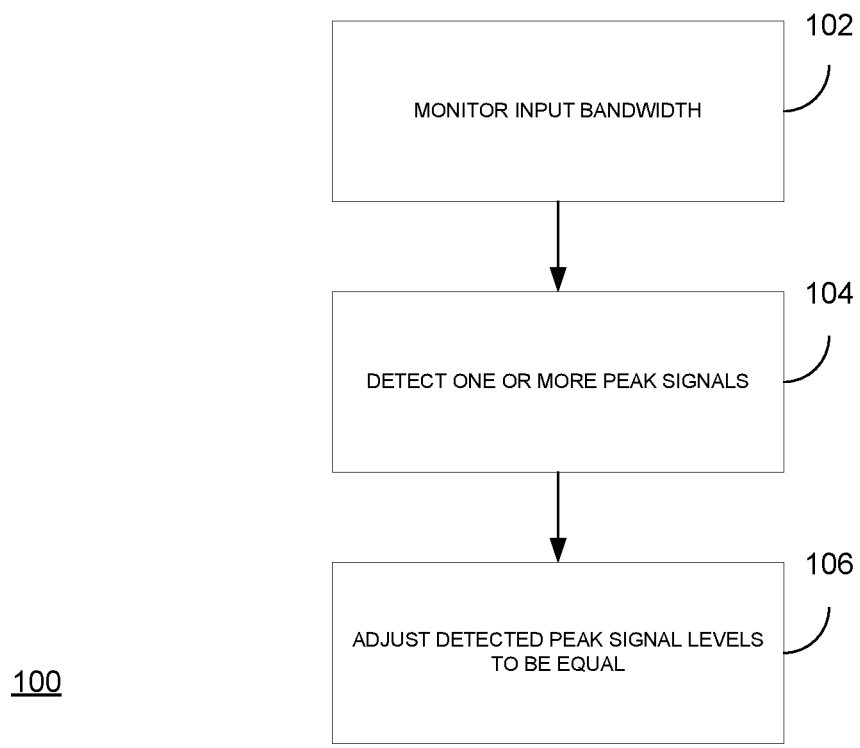
FIG. 1 is a flowchart of a method for achieving optimization of an antenna pattern.

In accordance with some implementations, a first method 100 to achieve optimization of an antenna pattern is disclosed and also illustrated in FIG. 1. The signals from different operators are typically transmitted at different carrier frequencies within an operating bandwidth. At 102 input bandwidth is monitored by the booster. At 104, one or more peak signal levels are detected. At 106 the peak signal levels that are detected are adjusted at the input so that they are roughly equal. This method 100 should work on average but would not take into account signal loading conditions which could make the total received signal strength indiction (RSSI) from a base station fluctuate significantly.

Figure 2:
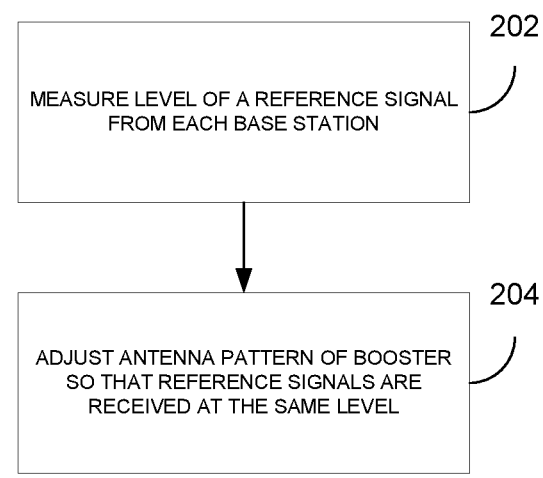
FIG. 2 is a flowchart of a method for achieving optimization of an antenna pattern, in accordance with an alternative implementation.

In accordance with some implementations, a second method 200 to achieve optimization of an antenna pattern is disclosed and also illustrated in FIG. 2. In this case, at 202 a level of a reference signal transmitted from each base station is measured, and at 204 the antenna pattern is adjusted so that the reference signals are received by a receiver at the same level. For example, in the case of LTE systems, a reference signal receive power (RSRP) value of each base station can be measured by a receiver of the reference signal, and the antenna pattern of the booster can be adjusted to equalize the RSRP levels, particularly across multiple boosters.

In yet other implementations, signal level equalization can be achieved by using multiple directional antennas, such as the type illustrated in the system of FIG. 1, and setting the direction in which these antennas are pointing in such a way that the desired signal equalization is achieved. This directional setting may be done manually or automatically using motorized antenna drives for example.

One or more aspects or features of the subject matter described herein can be realized in digital electronic circuitry, integrated circuitry, specially designed application specific integrated circuits (ASICs), field programmable gate arrays (FPGAs) computer hardware, firmware, software, and/or combinations thereof. These various aspects or features can include implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device. The programmable system or computing system may include clients and servers. A client and server are generally remote from each other and typically interact through a communication network. The relationship of client and server arises by virtue of computer programs running on the respective computers and having a client-server relationship to each other.

These computer programs, which can also be referred to programs, software, software applications, applications, components, or code, include machine instructions for a programmable processor, and can be implemented in a high-level procedural language, an object-oriented programming language, a functional programming language, a logical programming language, and/or in assembly/machine language. As used herein, the term "machine-readable medium" refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" refers to any signal used to provide machine instructions and/or data to a programmable processor. The machine-readable medium can store such machine instructions non-transitorily, such as for example as would a non-transient solid-state memory or a magnetic hard drive or any equivalent storage medium. The machine-readable medium can alternatively or additionally store such machine instructions in a transient manner, such as for example as would a processor cache or other random access memory associated with one or more physical processor cores.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." Use of the term "based on," above and in the claims is intended to mean, "based at least in part on," such that an unrecited feature or element is also permissible.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

Although a few embodiments have been described in detail above, other modifications are possible. Other embodiments may be within the scope of the following claims.

The invention claimed is:

1. A method of optimizing an antenna pattern for a booster, in which input signals from different operators are transmitted at different carrier frequencies within an operating bandwidth, the method comprising:
    monitoring, by the booster, an input bandwidth of a plurality of input signals at an input of the booster, the input bandwidth being within the operating bandwidth;
    detecting, by the booster, one or more peak signal levels of the plurality of input signals within the input bandwidth; and
    adjusting, by the booster, each of the detected one or more peak signal levels of the plurality of input signals at the input of the booster, such that a peak signal level of each of the plurality of input signals are substantially equal.

2. The method in accordance with claim 1, wherein the monitoring, detecting, and adjusting are performed by a control processor associated with the booster.

3. The method in accordance with claim 2, wherein the control processor is integrated with the booster.

4. The method in accordance with claim 1, further comprising outputting, by the booster, a plurality of output signals having a constant output level.

5. The method in accordance with claim 4, wherein a coverage footprint of the booster has a predetermined antenna pattern based on the adjusting and outputting.

6. A system for optimizing repeating by a repeater of input signals from different operators, where are transmitted at different carrier frequencies within an operating bandwidth, the system comprising:
    a booster integrated with the repeater, the booster being configured to:
        monitor an input bandwidth of a plurality of input signals at an input of the booster, the input bandwidth being within the operating bandwidth;
        detect one or more peak signal levels of the plurality of input signals within the input bandwidth; and
        adjust each of the detected one or more peak signal levels of the plurality of input signals at the input of the booster, such that a peak signal level of each of the plurality of input signals are substantially equal.

7. The system in accordance with claim 6, wherein the monitoring, detecting, and adjusting are performed by a control processor associated with the booster.

8. The system in accordance with claim 7, wherein the control processor is integrated with the booster.

9. The system in accordance with claim 6, wherein the booster is further configured to output a plurality of output signals having a constant output level.

10. The system in accordance with claim 9, further comprising one or more antennas, and wherein a coverage footprint of the one or more antennas of the booster have a predetermined antenna pattern based on the adjusting and outputting.

11. A computer program product for optimizing an antenna pattern for a booster, in which input signals from different operators are transmitted at different carrier frequencies within an operating bandwidth, the computer program product comprising:
    a programmable processor; and
    a machine-readable medium storing instructions that, when executed by the processor, cause the at least one programmable processor to:
        monitor an input bandwidth of a plurality of input signals at an input of the booster, the input bandwidth being within the operating bandwidth;
        detect one or more peak signal levels of the plurality of input signals within the input bandwidth; and
        adjust each of the detected one or more peak signal levels of the plurality of input signals at the input of the booster, such that a peak signal level of each of the plurality of input signals are substantially equal.

12. The computer program product in accordance with claim 11, wherein the programmable processor forms a control processor associated with the booster, and wherein the monitoring, detecting, and adjusting are performed by the control processor.

13. The computer program product in accordance with claim 12, wherein the control processor is integrated with the booster.

14. The computer program product in accordance with claim 11, wherein the instructions further cause the at least one programmable processor to output a plurality of output signals having a constant output level.

15. The computer program product in accordance with claim 14, wherein a coverage footprint of the booster has a predetermined antenna pattern based on the adjusting and outputting.

* * * * *